United States Patent
Kuhnt et al.

(10) Patent No.: US 6,805,010 B2
(45) Date of Patent: Oct. 19, 2004

(54) PRESSURE SENSOR MODULE

(75) Inventors: Winfried Kuhnt, Stuttgart (DE); Martin Mast, Gerlingen (DE); Masoud Habibi, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 18 days.

(21) Appl. No.: 10/169,451

(22) PCT Filed: Oct. 31, 2001

(86) PCT No.: PCT/DE01/04123
§ 371 (c)(1),
(2), (4) Date: Nov. 8, 2002

(87) PCT Pub. No.: WO02/37074
PCT Pub. Date: May 10, 2002

(65) Prior Publication Data
US 2003/0115967 A1 Jun. 26, 2003

(30) Foreign Application Priority Data
Nov. 1, 2000 (DE) .......................... 100 54 013

(51) Int. Cl.⁷ ............................... G01L 7/00
(52) U.S. Cl. ........................... 73/756; 73/700
(58) Field of Search .......... 73/700, 706, 714, 73/727, 723

(56) References Cited

U.S. PATENT DOCUMENTS

| | | |
|---|---|---|
| 5,581,038 A | 12/1996 | Lampropoulos et al. |
| 5,606,516 A | 2/1997 | Douglas et al. |
| 5,869,766 A * | 2/1999 | Cucci et al. .................. 73/706 |
| 5,955,678 A * | 9/1999 | Chapman et al. ............. 73/756 |
| 6,221,024 B1 | 4/2001 | Miesel |
| 6,668,658 B2 * | 12/2003 | Woersinger et al. .......... 73/723 |

FOREIGN PATENT DOCUMENTS

| | | |
|---|---|---|
| DE | 32 43 098 | 5/1984 |
| DE | 197 24 025 | 12/1998 |
| DE | 197 29 699 | 1/1999 |
| DE | 197 31 420 | 1/1999 |
| EP | 1 134 557 | 9/2001 |
| JP | 07-294358 | 10/1995 |
| WO | WO 98/00692 | 1/1998 |
| WO | WO 01/23856 | 4/2001 |

OTHER PUBLICATIONS

Patent Abstracts of Japan, vol. 1998, No. 07, Mar. 31, 1998
mstnews 2/99, pp. 8 to 9.

* cited by examiner

*Primary Examiner*—Edward Lefkowitz
*Assistant Examiner*—Andre Allen
(74) *Attorney, Agent, or Firm*—Kenyon & Kenyon

(57) ABSTRACT

A pressure sensor module includes a pressure sensor in a sensor housing, the pressure sensor being easily mountable and pre-calibrated.

14 Claims, 3 Drawing Sheets

PRESSURE SENSOR MODULE

FIELD OF THE INVENTION

The present invention relates to a pressure sensor module.

BACKGROUND INFORMATION

A pressure sensor device that includes a semiconductor chip having a pressure sensor is described in International Published Patent Application No. WO 98/00692. The arrangement is intended for mounting on a p.c. board. The electric leads of the semiconductor chip are not hermetically injected in the plastic of the housing. In the presence of a partial vacuum in the area of the pressure sensor, air may be drawn along the leads into the gel, mechanically stressing the bonding wires, i.e., bonds. In addition, the separating membrane corrupts the pressure characteristic of the semiconductor chip, due to its rigidity. In situations that require stricter measuring accuracy, it may therefore be required to increase the membrane diameter and reduce the membrane thickness. This may have a negative effect on miniaturization.

A pressure sensor chip that is mounted and fastened as a single unit in a pressure sensor module housing is described from mstnews 2/99, pages 8 to 9. It may not be possible to calibrate the pressure sensor until after the pressure sensor chip has been mounted, since mounting the pressure sensor chip and passivating it with a covering arrangement may influences a calibration curve. Therefore, the entire module housing, including the attached pressure sensor, may need to be exposed to different temperatures and pressures to achieve calibration. The long waiting period for heating the large sensor housing and the low packing density for calibration may make this very expensive.

In the case of the conventional pressure sensor, the reject rate during calibration may also not be detected until after the sensor chip is mounted. When this happens, the expensive pressure sensor module housing may no longer be usable. This may increases costs due to rejection.

A pressure sensor module in which the pressure sensor is sealed pressure-tight by a cover is described in German Published Patent Application No. 197 314 20. This mounting method may be expensive, as may be the use of a ceramic substrate. In addition, the frame surrounding the gel may need to be separately attached to the ceramic substrate.

SUMMARY

A pressure sensor module according to the present invention may provide a simple arrangement for mounting a pressure sensor in a module housing and producing a pressure sensor module.

A sensor housing may be made of plastic because the latter may be easy to produce.

Electric leads may be surrounded, at least in part, by the sensor housing, which holds them in place and enables the leads to pass through the sensor housing.

To protect a pressure sensor in its sensor housing against external ambient conditions and encapsulate it in a pressure-tight manner, the sensor housing may be surrounded by an encapsulating compound. In addition, the encapsulating compound may achieves a gas-tight passage for the leads.

The pressure sensor may have elements for improving electromagnetic compatibility.

As elements for improving electromagnetic compatibility, capacitors are advantageously connected electrically and mechanically to the electric leads by conductive adhesive, soldering or welding.

A media-resistant gel, such as fluorosilicone gel, may be used as the covering arrangement for the pressure sensor chip, so that other protection measures may be rendered unnecessary.

DETAILED DESCRIPTION

Figure 1:
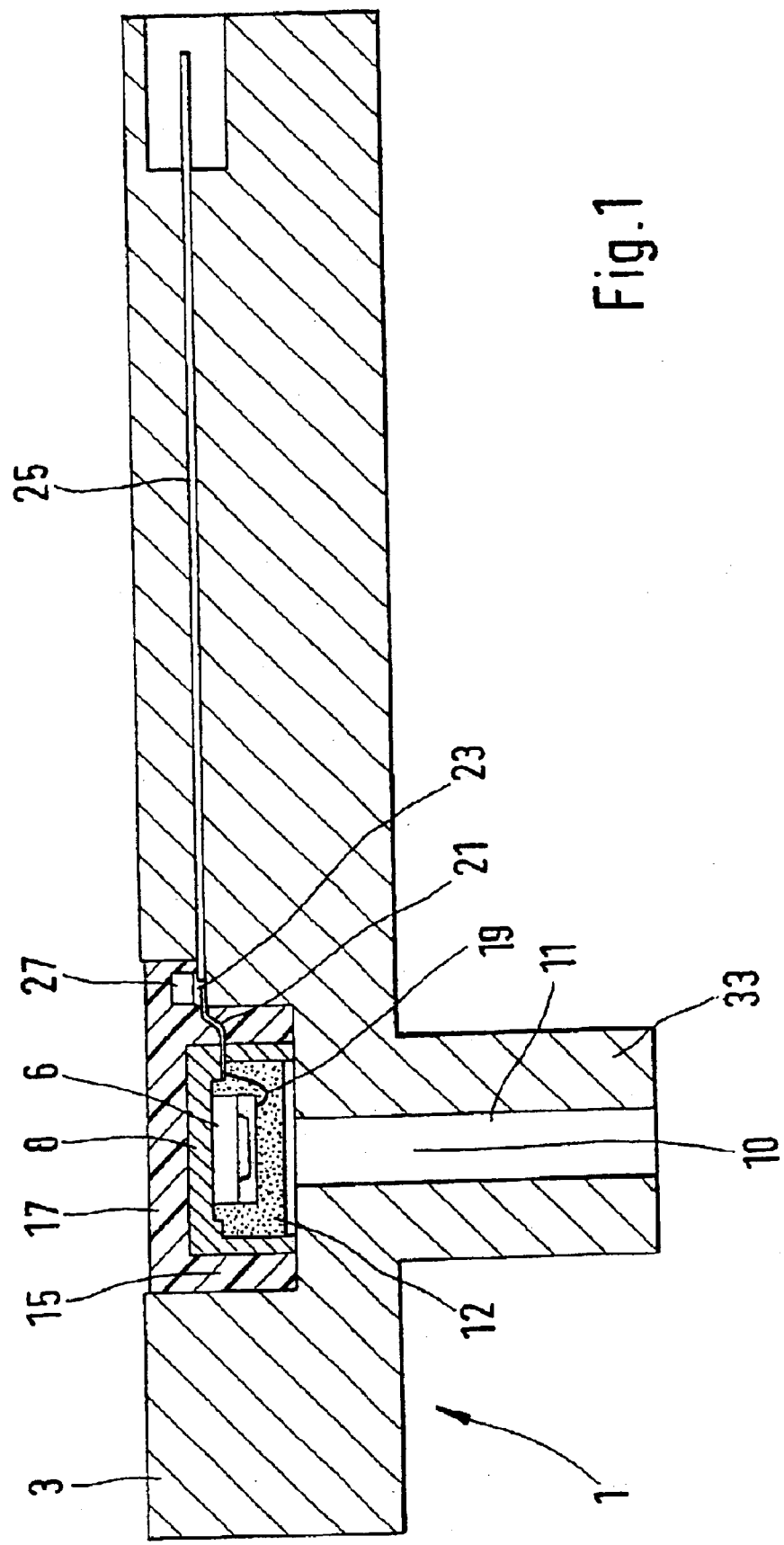
FIG. 1 illustrated a first example embodiment of a pressure sensor module configured according to the present invention.

FIG. 1 illustrates a first example embodiment of a pressure sensor module 1 according to the present invention. Pressure sensor module 1 includes, among other things, a module housing 3, in which a pressure sensor 6, for example in the form of a sensor chip, is provided in a sensor housing 8. Pressure sensor 6 is in contact with a medium 10 to be measured, which reaches pressure sensor 6, for example, via a connecting sleeve 33. Sensor housing 8 may be, for example, in the shape of a U, with the opening of the U shape coming into contact with the medium 10 to be measured and may be completely surrounding an opening 11 of connecting sleeve 33. Pressure sensor 6 is covered and therefore protected by a covering arrangement, for example a gel, in its sensor housing 8.

Sensor housing 8 may be arranged, for example, in a recess 15 of module housing 3 and may be completely surrounded, for example, by an encapsulating compound 17. Encapsulating compound 17 seals sensor housing 8 and module housing 3 so that a medium 10 to be measured may not penetrate recess 15. In addition, encapsulating compound 17, which may be required to be cured, may hold sensor housing 8 in recess 15, and it may also seals electric leads 21 passing through sensor housing 8. This makes it unnecessary to provide a cover that hermetically encapsulates recess 15 and protects it against external influences.

Pressure sensor 6 is connected by bonding wires 19 to electric leads 21, which establish the connection to external electrical connector elements 25. Connector elements 25 may serve the purpose of connecting the arrangement to an electronic controller. Junction 23 between connector elements 25 and leads 21, which may be produced by welding or soldering, is also located in recess 15 in encapsulating compound 17.

Pressure sensor module 1 has, for example, at least one further element 27 in recess 15 for improving electromagnetic compatibility, for example in the form of capacitors. Capacitors 27 are electrically and mechanically attached to electric leads 21 or connector elements 25, for example, by conductive adhesive, soldering or welding. Capacitors 27 may be arranged, for example, directly at junction 23.

Figure 2:
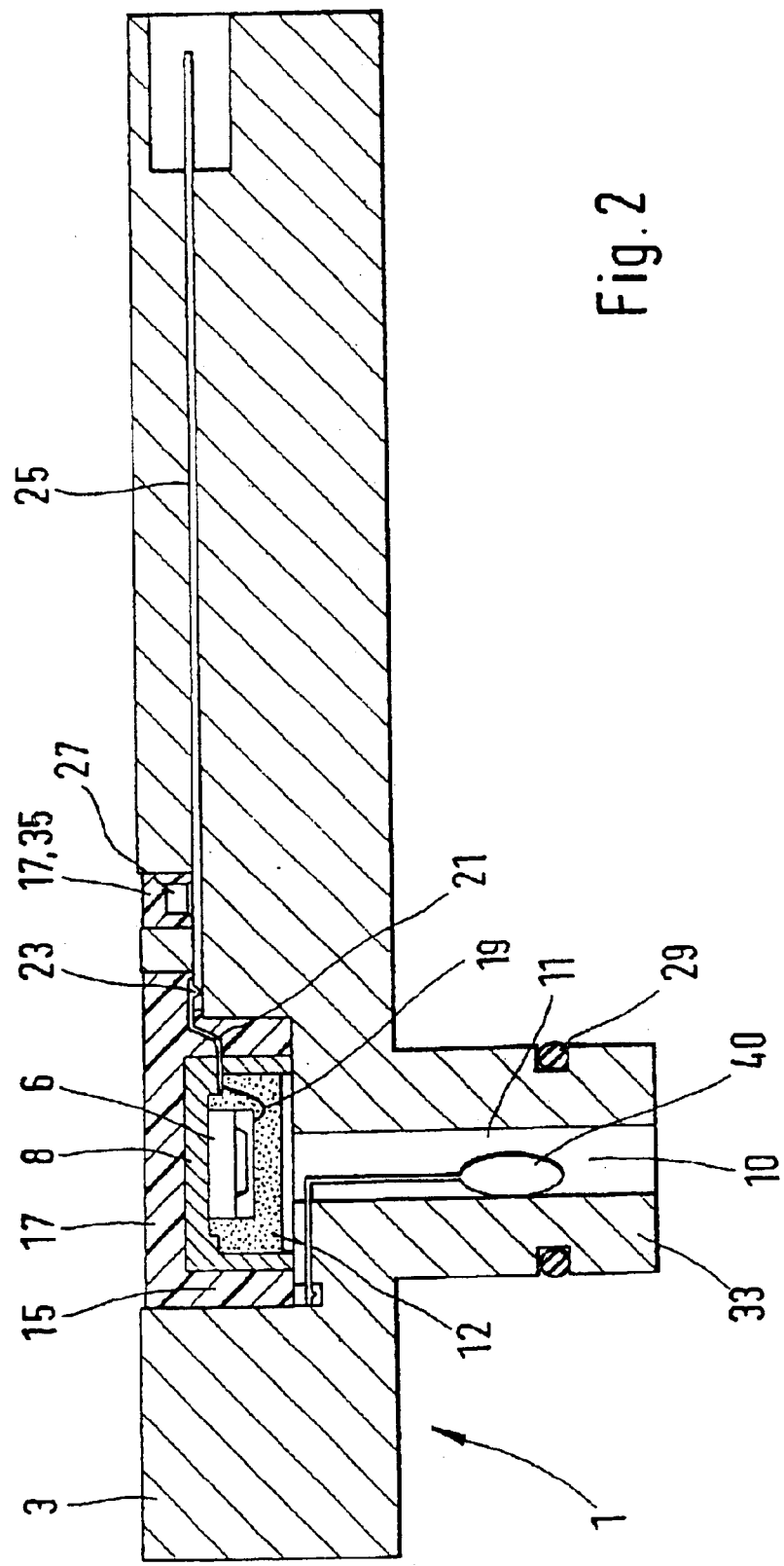
FIG. 2 illustrates a second example embodiment of a pressure sensor module configured according to the present invention.

FIG. 2 shows a further exemplary embodiment of a pressure sensor module 1 according to the present invention. In this case, module housing 3 may have, in addition to recess 15, a cavity 35 through which pass connector elements 25 or electric leads 21. Capacitors 27 may be electrically connected to connector elements 25 in cavity 35 and may be surrounded and protected by an encapsulating compound 17. Junction 23 may also be situated in cavity 35.

Because capacitors 27 are positioned at a greater physical distance from welded junction 23 between connector elements 25 and leads 21 than they are in FIG. 1, they are also be electrically connectable to electric leads 21 or connector elements 25 by soldering or gluing.

Module housing 3 also includes, for example, connecting sleeve 33 having a sealing ring 29 so that connecting sleeve 33 is insertable into a further component containing medium 10 to be measured. Connecting sleeve 33 is sealed against the component by sealing ring 29 so that medium 10 to be measured contained in the component may come into contact only with pressure sensor 6 and may not escape from the component at the point where connecting sleeve 33 is mounted.

Pressure sensor module 1 may also have a temperature sensor 40, for example an NTC resistor.

Figure 3:
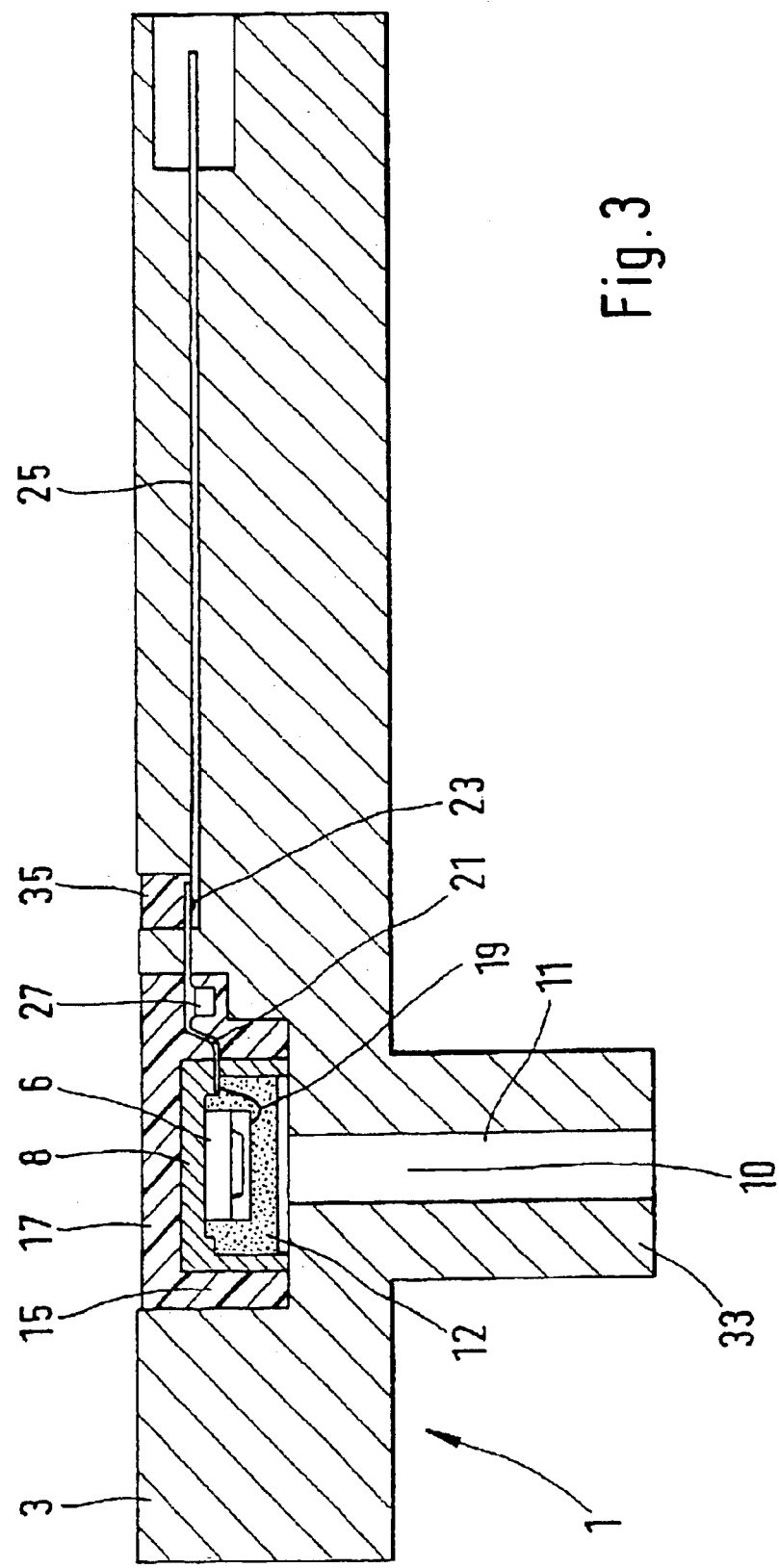
FIG. 3 illustrates a third embodiment of a pressure sensor module designed according to the present invention.

FIG. 3 shows a further exemplary embodiment of pressure sensor module 1 according to the present invention, based on FIG. 2. Welded junction 23 is located in cavity 35 so that elements 27 may be arranged as close as possible to pressure sensor 6, i.e., in recess 15.

What is claimed is:

1. A pressure sensor module, comprising:
   a module housing;
   a sensor housing arranged to rest at least partially against the module housing and have a separate configuration from the module housing;
   a pressure sensor arranged in the sensor housing;
   a covering arrangement configured to protect the pressure sensor; and
   at least one element configured to improve electromagnetic compatibility.

2. The pressure sensor module according to claim 1, wherein the pressure sensor includes electric leads partially surrounded by the sensor housing.

3. The pressure sensor module according to claim 2, further comprising external electrical connector elements electrically connected to the electric leads.

4. The pressure sensor module according to claim 1, wherein the sensor housing includes a plastic.

5. The pressure sensor module according to claim 1, wherein the covering arrangement includes a gel.

6. The pressure sensor module according to claim 1, further comprising an extruded plastic material surrounding and configured to hold the sensor housing in place in the module housing.

7. The pressure sensor module according to claim 1, further comprising an encapsulating compound surrounding and configured to hold the sensor housing in place in the module housing.

8. The pressure sensor module according to claim 1, wherein the module housing includes a recess, the sensor housing arranged in the recess.

9. The pressure sensor module according to claim 1, further comprising an encapsulation compound arranged to protect the element.

10. The pressure sensor module according to claim 1, wherein the element configured to improve magnetic compatibility includes a capacitor.

11. The pressure sensor module according to claim 1, wherein the element configured to improve electromagnetic compatibility is electrically and mechanically connected to electric leads by one of conductive adhesive, soldering, and welding.

12. The pressure sensor module according to claim 1, wherein the module housing includes a recess and a cavity formed separately from the recess, the pressure sensor arranged in the recess, the element configured to improve electromagnetic compatibility arranged in the cavity.

13. The pressure sensor module according to claim 1, wherein the module housing includes a recess, the pressure sensor and the element configured to improve electromagnetic capability arranged in the recess.

14. The pressure sensor module according to claim 1, further comprising a temperature sensor.

* * * * *